(12) United States Patent
Krishna et al.

(10) Patent No.: US 11,521,994 B2
(45) Date of Patent: Dec. 6, 2022

(54) OPEN CIRCUIT VOLTAGE PHOTODETECTOR

(71) Applicant: OHIO STATE INNOVATION FOUNDATION, Columbus, OH (US)

(72) Inventors: Sanjay Krishna, Plain City, OH (US); Earl Fuller, Columbus, OH (US); Waleed Khalil, Dublin, OH (US); Theodore Ronningen, Lewis Center, OH (US); Alireza Kazemi, Rio Rancho, NM (US); Dale Shane Smith, Worthington, OH (US); Teressa Specht, Columbus, OH (US); Ramy Tantawy, Columbus, OH (US)

(73) Assignee: Ohio State Innovation Foundation, Columbus, OH (US)

( * ) Notice: Subject to any disclaimer, the term of this patent is extended or adjusted under 35 U.S.C. 154(b) by 186 days.

(21) Appl. No.: 16/769,693

(22) PCT Filed: Dec. 5, 2018

(86) PCT No.: PCT/US2018/064035
§ 371 (c)(1),
(2) Date: Jun. 4, 2020

(87) PCT Pub. No.: WO2019/113186
PCT Pub. Date: Jun. 13, 2019

(65) Prior Publication Data
US 2021/0375957 A1 Dec. 2, 2021

Related U.S. Application Data

(60) Provisional application No. 62/672,744, filed on May 17, 2018, provisional application No. 62/595,310, filed on Dec. 6, 2017.

(51) Int. Cl.
*H01L 27/146* (2006.01)
*H01L 27/142* (2014.01)
(Continued)

(52) U.S. Cl.
CPC ...... *H01L 27/142* (2013.01); *H01L 27/14669* (2013.01); *H01L 31/103* (2013.01); *H01L 31/108* (2013.01); *H03K 17/785* (2013.01)

(58) Field of Classification Search
None
See application file for complete search history.

(56) References Cited

U.S. PATENT DOCUMENTS 3,753,388 A 8/1973 Toyoda
9,123,607 B1 * 9/2015 Hatcher ............. H01L 27/1465
(Continued)

OTHER PUBLICATIONS

International Preliminary Report on Patentability dated Jun. 9, 2020 for International application No. PCT/US18/64035.
(Continued)

*Primary Examiner* — Benjamin P Sandvik
(74) *Attorney, Agent, or Firm* — Fay Sharpe LLP

(57) ABSTRACT

An open circuit voltage photodetector comprises a photovoltaic device including a photovoltaic junction, and a transistor. The photovoltaic device is connected to the gate terminal of the transistor to input an open circuit voltage of the photovoltaic device to the gate terminal. An array of such photodetectors and a readout integrated circuit forms an image sensor. In a photodetection method, an open circuit voltage is generated in a photovoltaic device in response to illumination by incident radiation, and the open circuit voltage is applied to a gate terminal of a transistor to modulate a channel current flowing in a channel of the transistor. A readout electronic circuit may be fabricated with an extra transistor, and a photovoltaic device disposed on the readout electronic circuit and electrically connected (Continued)

to apply an open circuit voltage of the photovoltaic device to a gate of the extra transistor.

20 Claims, 9 Drawing Sheets

(51) Int. Cl.
*H01L 31/103* (2006.01)
*H01L 31/108* (2006.01)
*H03K 17/785* (2006.01)

(56) References Cited

U.S. PATENT DOCUMENTS

| | | | | |
|---|---|---|---|---|
| 9,190,996 | B2* | 11/2015 | Chaintreuil | H03K 17/687 |
| 2006/0197112 | A1* | 9/2006 | Uchihara | H03K 17/78 |
| | | | | 257/213 |
| 2009/0115490 | A1 | 5/2009 | Minagawa | |
| 2010/0133418 | A1* | 6/2010 | Sargent | H01L 27/305 |
| | | | | 977/773 |
| 2017/0309656 | A1 | 10/2017 | Kirn | |
| 2020/0346004 | A1* | 11/2020 | Gappy | G06N 3/063 |

OTHER PUBLICATIONS

International Search Report dated Apr. 11.2019 for International application No. PCT/US18/64035.
Written Opinion of the International Searching Authority dated Apr. 11, 2019 for International application No. PCT/US18/64035.

\* cited by examiner

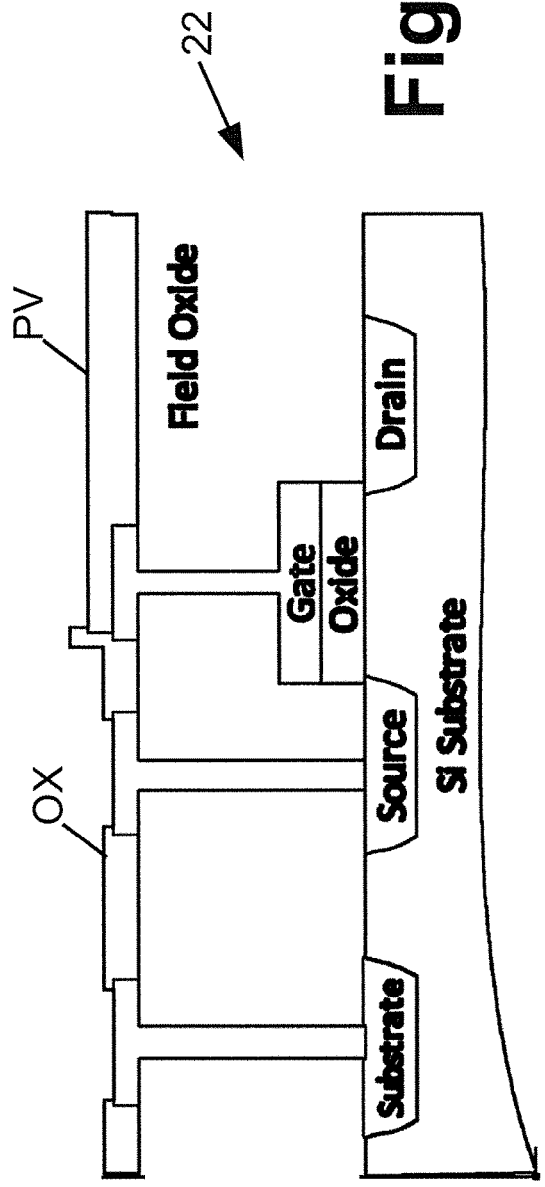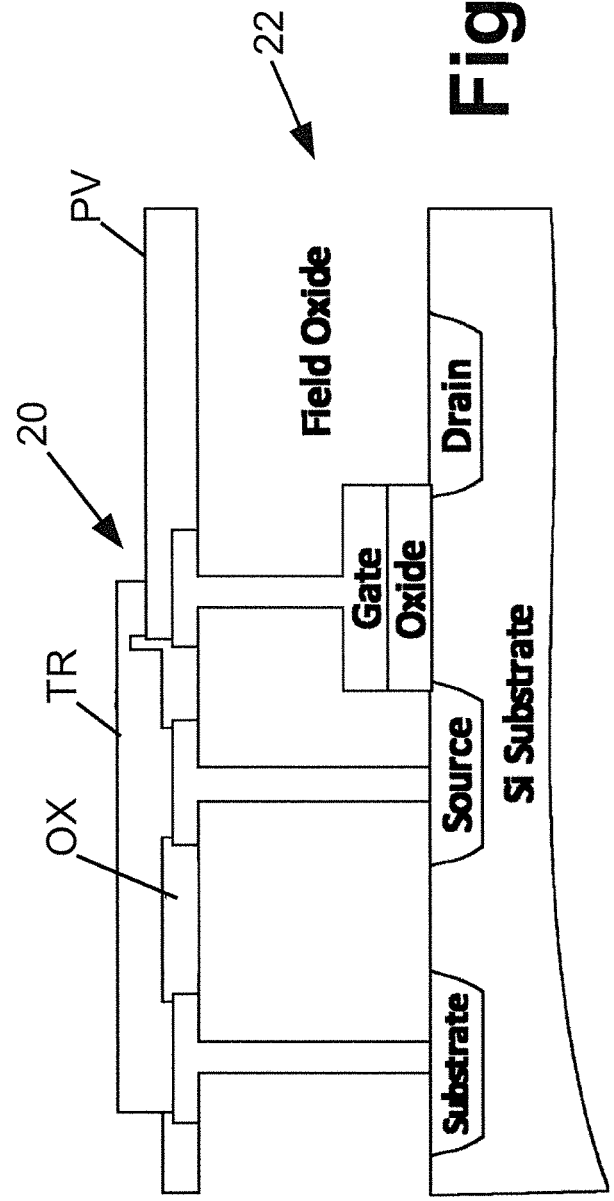

OPEN CIRCUIT VOLTAGE PHOTODETECTOR

CROSS-REFERENCE TO RELATED APPLICATIONS

This application is the U.S. National Phase of PCT International Application No. PCT/US2018/064035 filed Dec. 5, 2018 which claims priority to and the benefit of U.S. Provisional Application No. 62/672,744 filed May 17, 2018 and U.S. Provisional Application No. 62/595,310 filed Dec. 6, 2017 said applications titled "Open Circuit Voltage Photodetector". U.S. Provisional Application No. 62/672,744 is incorporated herein by reference in its entirety. U.S. Provisional Application No. 62/595,310 is incorporated herein by reference in its entirety.

BACKGROUND

Sensing and imaging of light is typically done by direct current generation from a light sensitive material. The low energy from infrared (IR) radiation is able to generate photoelectrons in materials with low band gap and the resulting photocurrent is then available for downstream sensing circuitry to quantify the IR illumination. Advantageously, these materials typically respond linearly to incident illumination.

A known commercial image sensor pixel configuration leveraging a direct current generation photodetector is the Complementary Metal-Oxide-Semiconductor (CMOS) image sensor (CIS). One specific CIS topology is the CIS-4T pixel unit cell architecture, which is so-named because it employs four transistors (i.e. "4T"). Other variants of CIS pixel unit cell topologies are also available, such as 2T and 3T. Advantageously, CIS technology is readily integrated with CMOS electronics.

However, detector devices operating by generation of direct current can suffer from high levels of dark currents. This random current that exist when there is no illumination may come from thermal effects, among other causes. A way to reduce the dark current is by way of a significant reduction in the temperature of the material, often to cryogenic temperatures, in order for the illuminated current to be readily detected above this noise level. However, cooling significantly adds to the system level cost and has been a barrier to widespread commercial adoption of infrared sensing and imaging products.

BRIEF DESCRIPTION

In some illustrative embodiments disclosed as illustrative examples herein, an open circuit voltage photodetector (VocP) comprises a photovoltaic device including a photovoltaic junction, and a transistor having a gate terminal, in which the photovoltaic device is connected to the gate terminal of the transistor to input an open circuit voltage of the photovoltaic device to the gate terminal of the transistor.

An image sensor may comprise an array of such photodetectors, and may further include a readout integrated circuit (ROIC).

In a photodetection method, an open circuit voltage is generated in a photovoltaic device in response to illumination by incident radiation, and the open circuit voltage is applied to a gate terminal of a transistor to modulate a channel current flowing in a channel of the transistor.

In a fabrication method, a readout electronic circuit including an extra transistor is fabricated, and a photovoltaic device is disposed on the readout electronic circuit and electrically connected to apply an open circuit voltage of the photovoltaic device to a gate of the extra transistor.

BRIEF DESCRIPTION OF THE DRAWINGS

Unless otherwise noted, the drawings are not to scale or proportion. The drawings are provided only for purposes of illustrating preferred embodiments and are not to be construed as limiting.

FIGS. 7, 8, 9, and 10 diagrammatically illustrate a suitable fabrication process for manufacturing the VocP of FIGS. 1 and 2 using MOS fabrication.

DETAILED DESCRIPTION OF PREFERRED EMBODIMENTS

Figure 1:
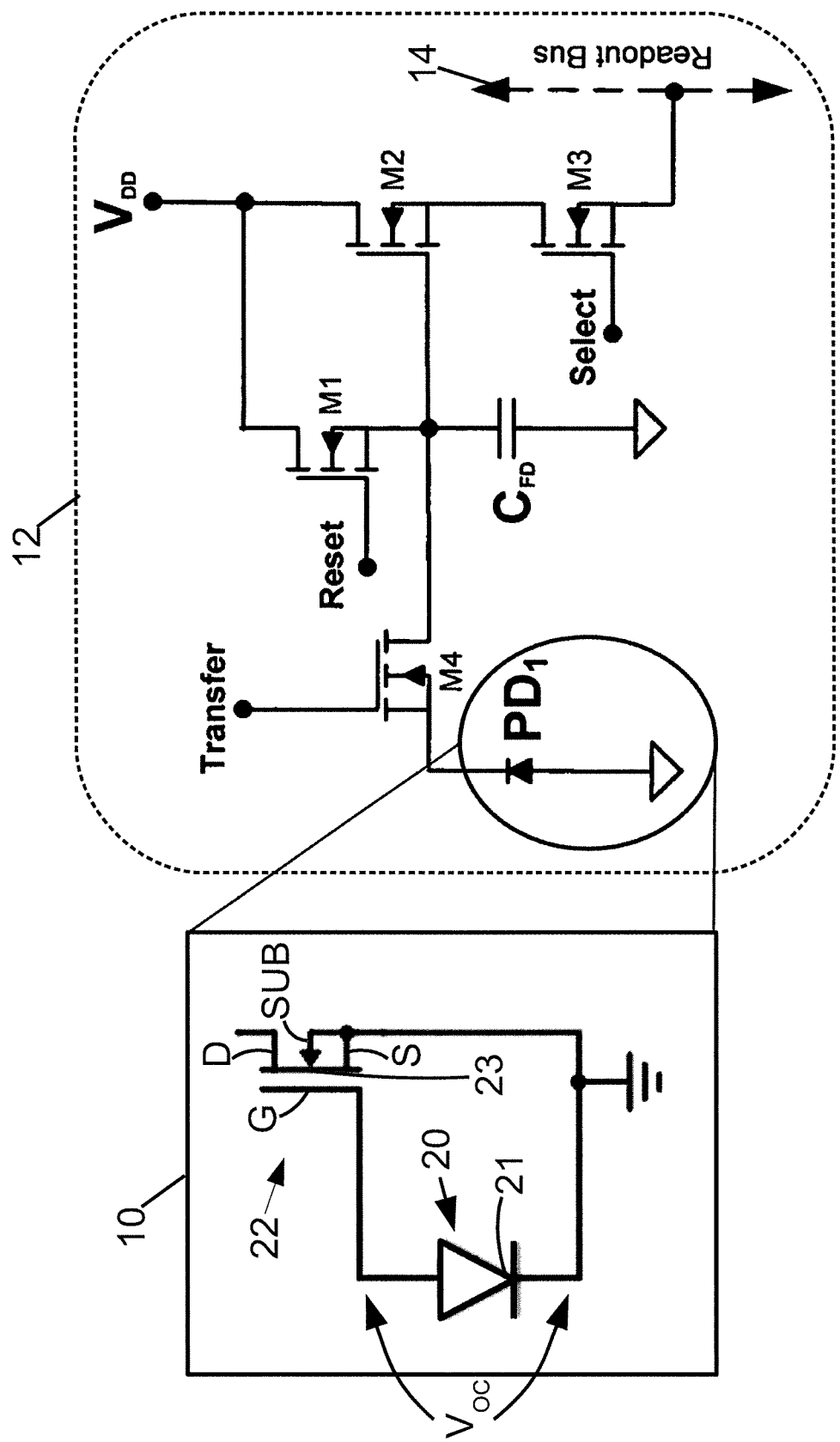
FIG. 1 diagrammatically shows a Complementary Metal-Oxide-Semiconductor (CMOS) image sensor (CIS) pixel unit cell employing four transistors ("CIS-4T") in which the conventional photoconductive photodiode is replaced by an open circuit voltage photodetector (VocP) as disclosed herein.

In some embodiments disclosed herein, a photodetector comprising an open circuit voltage photodetector.

In some embodiments disclosed herein, a photodetector comprises a photovoltaic device including a photovoltaic junction, and a transistor having a gate terminal. The photovoltaic device is connected to the gate terminal of the transistor to input an open circuit voltage of the photovoltaic device to the gate terminal of the transistor. In some such photodetector embodiments, the transistor is a metal-oxide-semiconductor field-effect transistor (MOSFET). The photovoltaic device may include a plurality of photovoltaic junctions electrically connected in series to define a two terminal photovoltaic device having an anode and a cathode. The photovoltaic device may, for example, comprise a pn junction or a Schottky junction. In some embodiments, the photovoltaic device comprises an infrared photovoltaic device.

In some embodiments, the photodetector comprises a hybrid device in which the transistor is silicon-based and the photovoltaic device comprises a compound III-V photovoltaic device, a compound II-VI photovoltaic device, a compound IV-VI photovoltaic device, a lead selenide (PbSe) photovoltaic device, a quantum well infrared photodetector (QWIP) or a quantum dot infrared photodetector (QDIP).

In some embodiments, besides having a gate terminal, the transistor further includes a channel having a channel current modulated by voltage on the gate terminal, and the photodetector further comprises a readout electronic circuit electrically connected with the channel of the transistor to output a voltage dependent upon the channel current. An image sensor may be constructed, comprising an array of such photodetectors. The readout electronic circuit may, for example, comprise a readout integrated circuit (ROIC). In one more specific example, the transistor of each photodetector comprises a metal-oxide-semiconductor field-effect transistor (MOSFET), the ROTC for each photodetector comprises a circuit based on transistors or other elements, and the image sensor comprises a CMOS Image Sensor based on CIS unit cells such as CIS-4T.

In some method embodiments disclosed herein, a photodetection method comprises: generating an open circuit voltage in a photovoltaic device in response to illumination by incident radiation; and applying the open circuit voltage to a gate terminal of a transistor to modulate a channel current flowing in a channel of the transistor.

In some device fabrication embodiments disclosed herein, a photodetector fabrication process comprises: fabricating a readout electronic circuit including an extra transistor; and disposing a photovoltaic device on the readout electronic circuit with the photovoltaic device electrically connected to apply an open circuit voltage of the photovoltaic device to a gate of the extra transistor. In some such fabrication embodiments, the readout electronic circuit fabrication includes fabricating the readout electronic circuit including the extra transistor as a silicon-based metal-oxide-semiconductor (MOS) circuit.

Disclosed herein are embodiments of an Open Circuit Voltage Photodetector (OCVP or VocP). The disclosed VocP uses a two-step process to convert incident radiation into a measurable photocurrent using a photodiode coupled to a metal oxide semiconductor (MOS) transistor or other transistor. First, the incident radiation produces an open circuit voltage (OCV) in the photodiode that is proportional to the irradiance of the light. The open circuit voltage is then coupled to the gate of a MOS transistor thereby producing a current that is proportional to the OCV. Advantages over the traditional IR detection include: (1) the VocP advantageously creates a photovoltage, that is independent of detector area, rather than a photocurrent; (2) the current that is created in the transistor is much less than the dark current of a detector, especially in the infrared, thereby leading to reduced noise; and (3) the coupling of the photovoltage with the MOS transistor can be implemented in a standard silicon complementary metal oxide semiconductor (CMOS) foundry enabling low cost infrared sensors and imagers.

Figure 2:
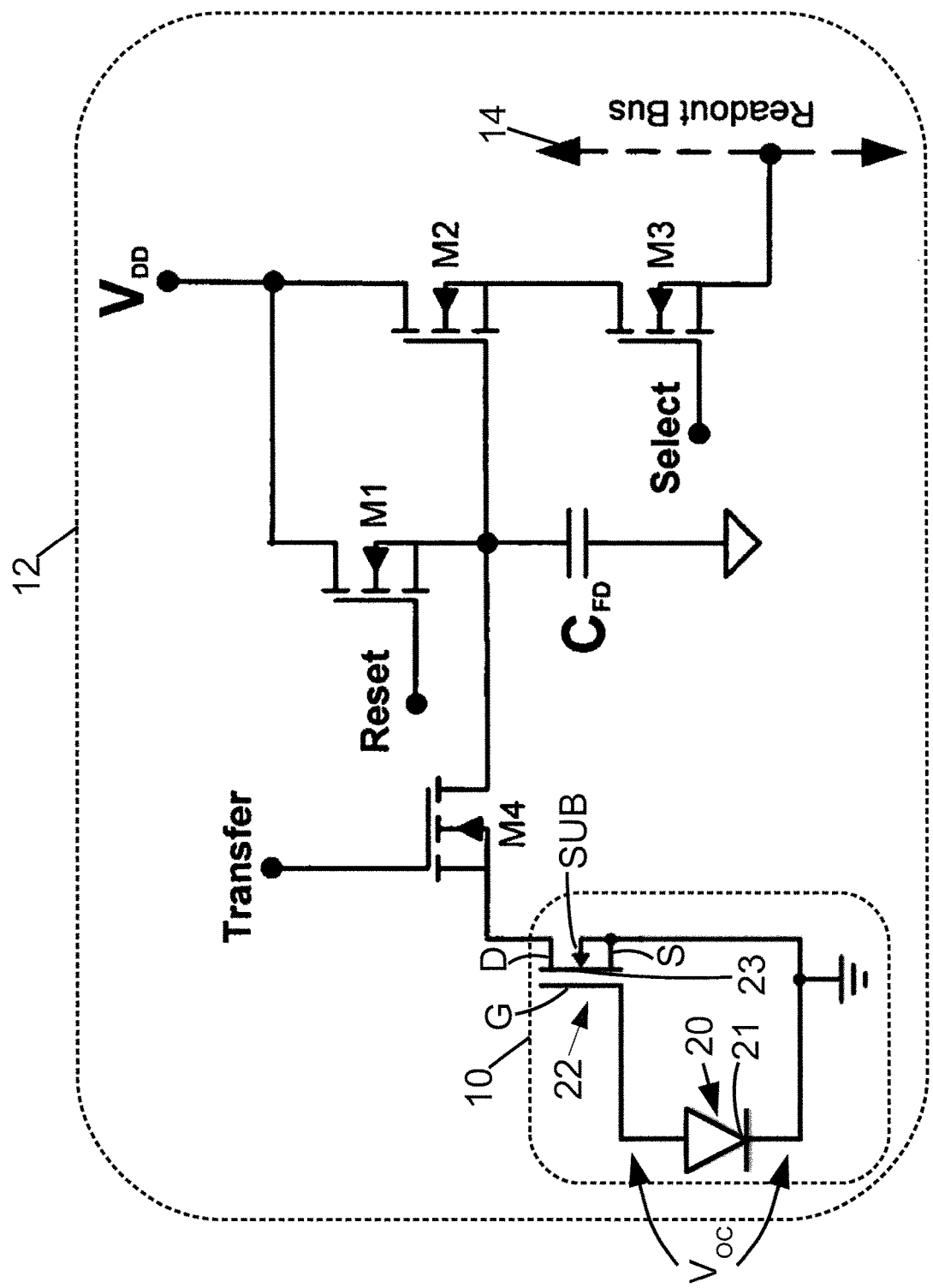
FIG. 2 diagrammatically shows the CIS-4T pixel unit cell of FIG. 1 with the replacement VocP in place.

With reference to FIGS. 1 and 2, an illustrative example is shown, in which an Open Circuit Voltage Photodetector (VocP) 10 is incorporated into a CMOS image sensor (CIS) employing an illustrative CIS-4T pixel 12. Specifically, as diagrammatically shown in FIG. 1, the VocP 10 replaces a conventional photodiode $PD_1$ which would conventionally operate by direct current generation from a light sensitive material. FIG. 2 illustrates the VocP-based CIS-4T pixel 12 with the drain of the transistor 22 of the VocP 10 connecting to the CIS-4T pixel 12. The CIS-4T pixel 12 further includes four transistors M1, M2, M3, M4 and a capacitor $C_{FD}$ in a conventional CIS-4T architecture shown in FIGS. 1 and 2, biased at a DC bias $V_{DD}$ to generate an output on the indicated readout bus 14. The illustrative VocP 10 includes a photovoltaic device 20 including a photovoltaic junction 21 diagrammatically indicated using a standard "diode" symbol, and a transistor 22 having a gate terminal G, a source terminal S, and a drain terminal D. The illustrative transistor 22 is a MOSFET having a channel 23 terminating at opposite ends by the source and drain terminals S, D. The illustrative transistor 22 is more particularly an n-MOSFET and includes a substrate terminal SUB as indicated in FIGS. 1 and 2. The photovoltaic device is connected to the gate terminal G of the transistor 22 to input an open circuit voltage ($V_{OC}$ of the photovoltaic device 20 to the gate terminal G of the transistor 22.

The illustrative VocP 10 of FIGS. 1 and 2 is a combination of the wave-length tuned, photovoltaic (PV) semiconductor junction 21, directly coupled to the gate G of the MOS transistor 22 so as enable the transistor output to respond to light input at various wavelengths including, in an illustrative infrared detector embodiment, infrared light from 1 μm to 14 μm. MOS transistors respond to voltage on the gate relative to the source/substrate and the drain current modulates according to the amount of voltage known as $V_{GS}$ (gate to source voltage). Photovoltaic junctions produce a voltage when illuminated and current is not allowed to flow (that is, in open circuit mode). This open circuit voltage ($V_{OC}$) varies directly with the amount of illumination and accordingly when connected to the gate of the transistor, will modulate the output drain current. It is advantageous to maintain linearity with respect to light illumination. In other words, as illumination increases, output current also increases linearly and proportionally. This permits downstream sensing circuitry to directly measure illumination very efficiently allowing for detection and imaging based on emitted, reflected, and absorbed light levels.

The operating principle of the VocP 10 is as follows. The IR photovoltaic diode 20 generates open circuit voltage ($V_{OC}$) as given by the expression:

$$V_{OC} = \frac{kT}{q} \ln\left(\frac{R_\lambda P_\lambda}{I_{sat}} + 1\right) \quad (1)$$

where k is the Boltzmann constant, T is the temperature, q is the elementary charge (that is, the magnitude of electric charge carried by a single proton or by a single electron), $I_{sat}$ is the saturation current of the photovoltaic junction, $R_A$ is the responsivity as a function of wavelength (suitably express in units of current generated per optical power, A/W), and $P_\lambda$ is the optical power at that wavelength. The MOSFET 22 preferably operates in its subthreshold regime for optimum drain-source current:

$$I_{DS}(V_{GS}) = I_{S,s-t} \exp\left(\frac{q(V_{GS} - V_T)}{n_T kT}\right) \quad (2)$$

where $I_{S,s-t}$ is the subthreshold transistor current, $V_T$ is the threshold voltage of the transistor, $n_T$ is the ideality factor of the transistor at temperature T, and $I_{DS}$ is the drain-source current. The photodiode 20 modulates the gate voltage (more specifically, $V_{GS}=V_{OC}$ in the topology of the illustrative VocP 10 of FIGS. 1 and 2) so the drain-source current is nearly linearly dependent on radiative power, linear in the case that $n_T$ is 1, as shown by inserting $V_{OC}$ of Equation (1) into Equation (2) so as to yield:

$$I_{DS}(V_{GS}) = I_{DS}(V_{OC}) = I_{S,s-t} \exp\left(\frac{q\left(\frac{kT}{q}\ln\left(\frac{R_\lambda P_\lambda}{I_{sat}} + 1\right) - V_T\right)}{n_T kT}\right) \quad (3)$$

which simplifies to:

$$I_{DS}(V_{OC}) = I_{S,s-t} \left( \frac{R_\lambda P_\lambda}{I_{sat}} + 1 \right)^{1/n_T} \exp\left( \frac{-qV_T}{n_T kT} \right) \quad (4)$$

Figure 3:
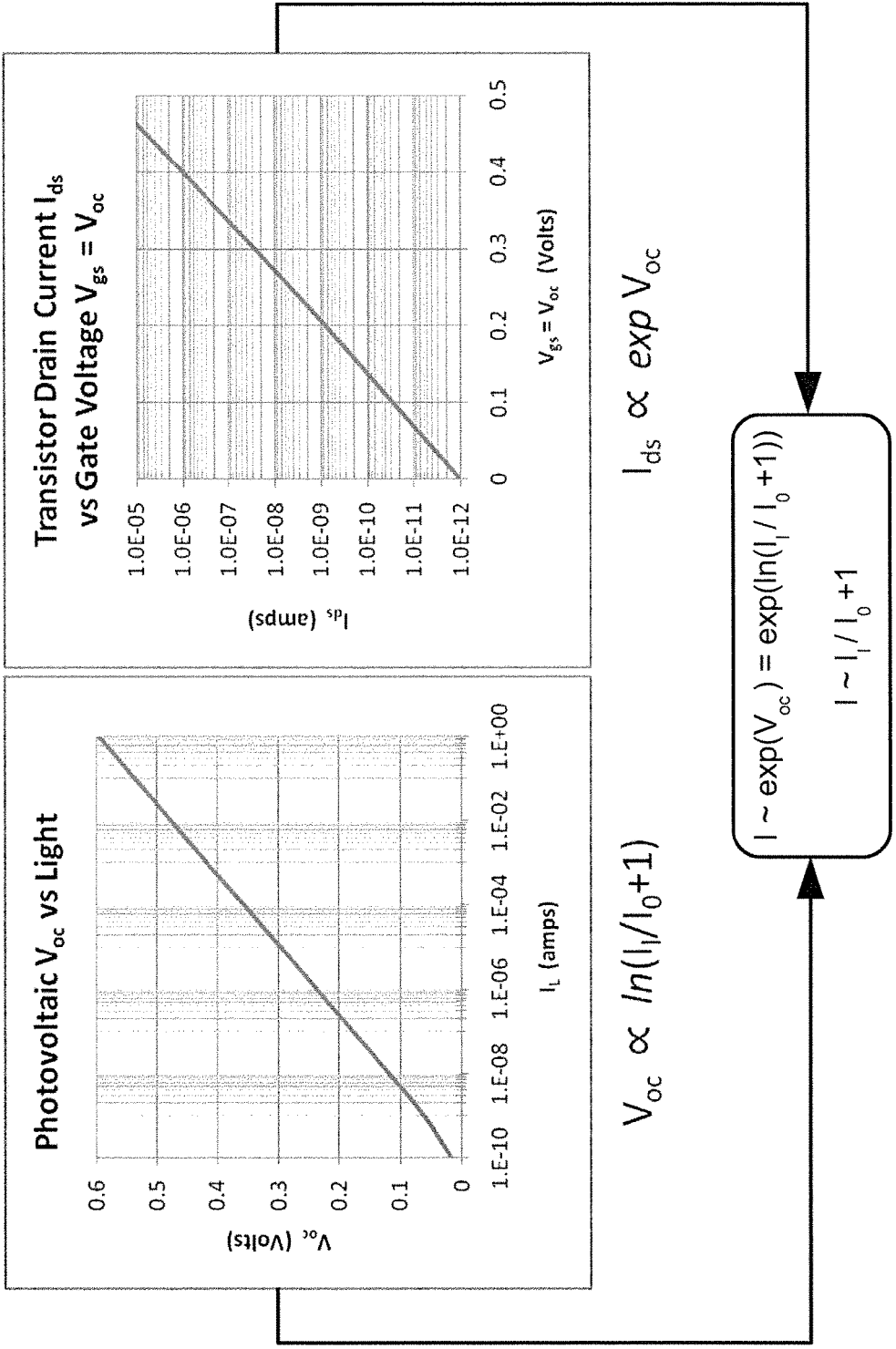
FIG. 3 graphically illustrates combination of logarithmic linearity of the photovoltaic detector of the VocP of FIGS. 1 and 2 with the exponential linearity of the transistor subthreshold current of the transistor of the VocP to produce linear photocurrent.

With continuing reference to FIGS. 1 and 2 and with further reference to FIG. 3, graphically the combination of logarithmic linearity of the photovoltaic detector 20 combines with the exponential linearity of the transistor subthreshold current of the transistor 22 to produce "photocurrent" linearity:

$$I_{DS} \propto \exp\left( \ln\left( \frac{I_l}{I_0} + 1 \right) \right) \quad (5)$$

which corresponds to Equation (3) with $1/I_0$ representing the constant terms. Leveraging cancellation of the natural log by the exponential, this reduces to:

$$I_{DS} \propto \frac{I_l}{I_0} + 1 \quad (6)$$

FIG. 3 graphically illustrates that the combination of logarithmic linearity of the photovoltaic detector 20 combines with the exponential linearity of the transistor subthreshold current of the transistor 22 to produce "photocurrent" linearity.

Advantageously, the dark current from the transistor 22 is not limited by the dark current of the photovoltaic detector 20. Silicon transistors have very small dark current and operate well at room temperature with a wide range. This reduces the noise of the VocP 10 compared to the conventional photoconductive and photovoltaic detector $PD_1$ of FIG. 1.

Moreover, the VocP design is compatible with standard silicon foundry processing, thus enabling wafer level integration leading to a lower cost of the infrared (or other wavelength range) imager/sensor chip. Possible approaches to wafer scale integration of the detector material include via wafer bonding at the die level, through the direct growth/deposition of the photosensitive material on the transistor, or through direct growth/deposition of the photosensitive material on contacts of the integrated circuit wafer, or die, containing the transistor. This allows the photovoltaic material to directly couple to the silicon transistor gate. Modern silicon transistors are very small (~500 nm$^2$) relative to the area of a single CIS IR pixel (~500 µm$^2$). Moreover, silicon fabrication processes routinely planarize the multiple layers of interconnect from/to the transistor. The planarization process lends itself well to the placement of an array of metal pads where the individual pixels can be placed and interconnects routed to the transistors below. Such placement solves the problem of coefficient of expansion mismatch between the IR materials and the silicon (4-5 vs. 2.6 µin/in). By contrast, an existing approach of stress relief is a challenging and costly hybrid attachment approach using an array of indium bumps between the silicon and the IR material with each pixel connected to its own indium bump to the silicon.

The VocP 10 is suitable for use as an individual detector, or in an array, such as linear arrays and focal plane arrays, e.g. using the CIS-4T pixel architecture as illustrated in FIGS. 1 and 2. Wafer scale integration of IR materials with CMOS in the VocP 10 allows room temperature operation and facilitates low cost IR detectors and imagers, particularly in the mid-wave (2 µm to 5.5 µm).

Figure 4:
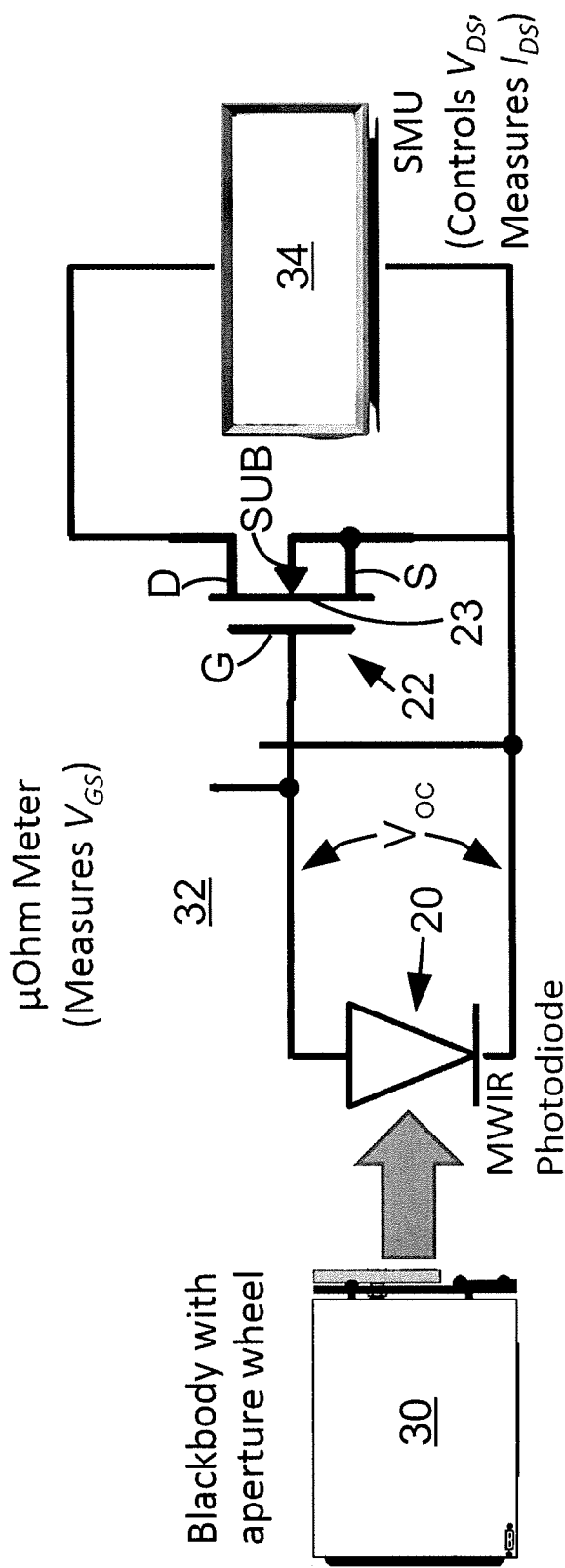
FIG. 4 illustrates a demonstration testing setup.
Figure 5:
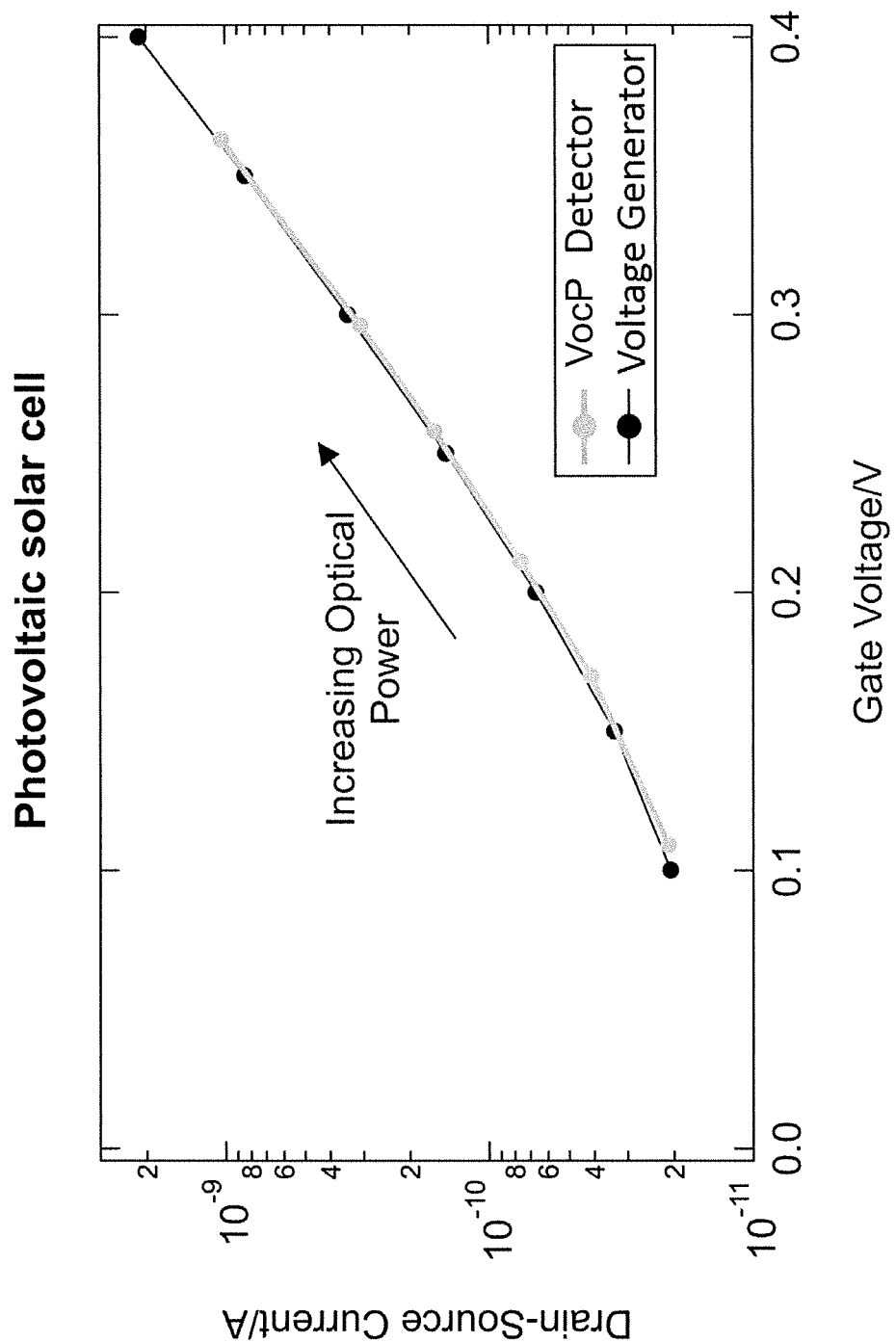
FIGS. 5 and 6 illustrate test results for the VocP of FIGS. 1 and 2 in which the photovoltaic detector is a solar cell (FIG. 5) or an InAsSb (indium arsenide antimonide) photovoltaic detector (FIG. 6).
Figure 6:
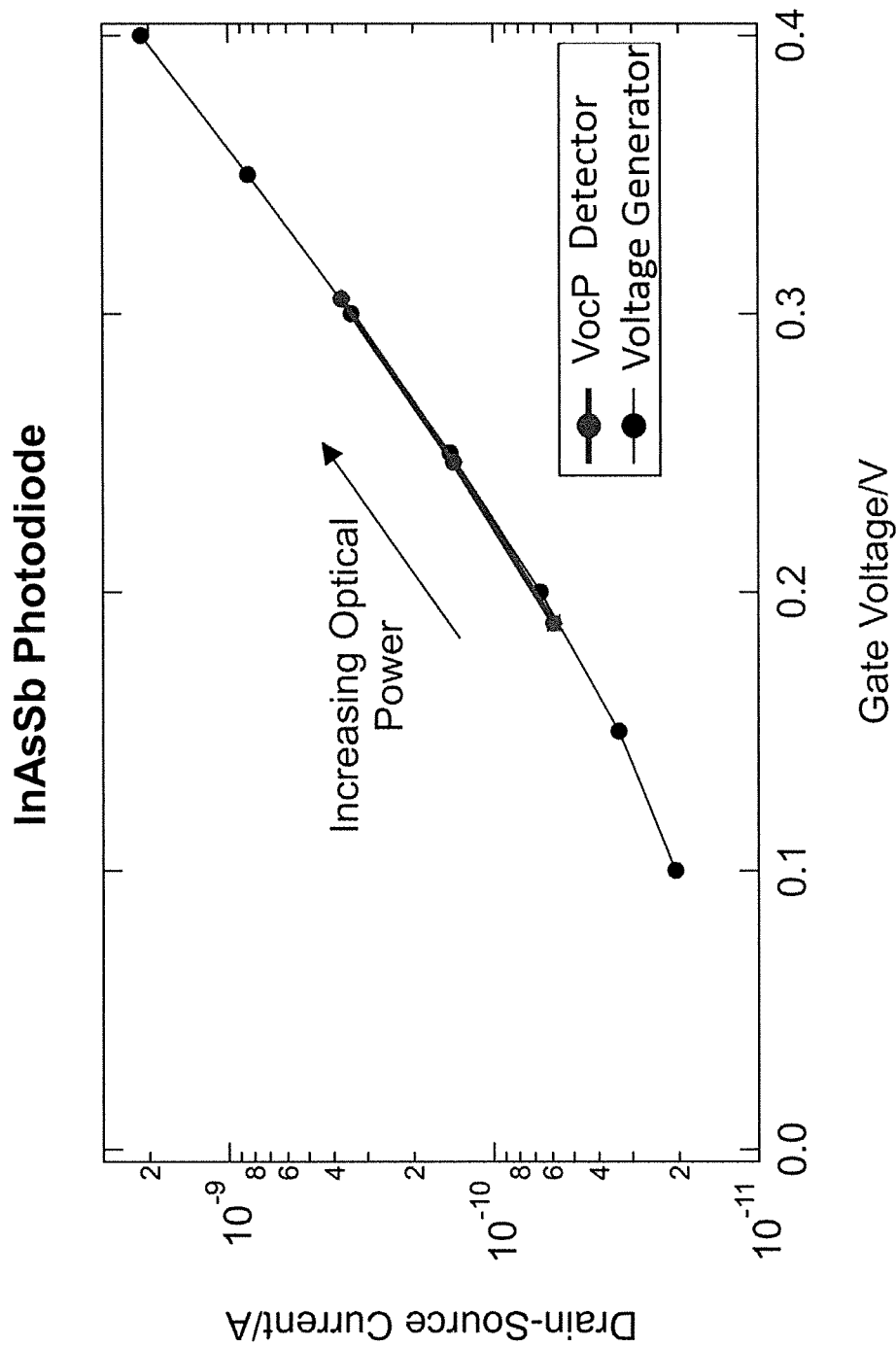

With reference to FIGS. 4-6, laboratory tests were performed to demonstrate that with discrete components, appropriate performance levels are achieved with commercial off the shelf components. FIG. 4 illustrates the demonstration testing setup. A blackbody IR source with an aperture wheel 30 provided mid-wavelength infrared (MWIR) illumination to the photovoltaic device 20. A µohmmeter 32 measured $V_{GS}$, while a source-measurement unit (SMU) 34 controlled $V_{DS}$ of the transistor 22 and measured $I_{DS}$ of the transistor 22. In the reported laboratory tests, the transistor 22 was a Philips BSH103 NMOS transistor. FIG. 5 presents results using a commercially available 5-inch square silicon solar cell as the photovoltaic device 20. $V_{OC}$ levels were achieved up to 0.5 volts with light shadowing over the cell. FIG. 6 presents results using a Hamamatsu P13243-011MA InAsSb (indium arsenide antimonide) photovoltaic detector as the photovoltaic device 20.

Figure 7:
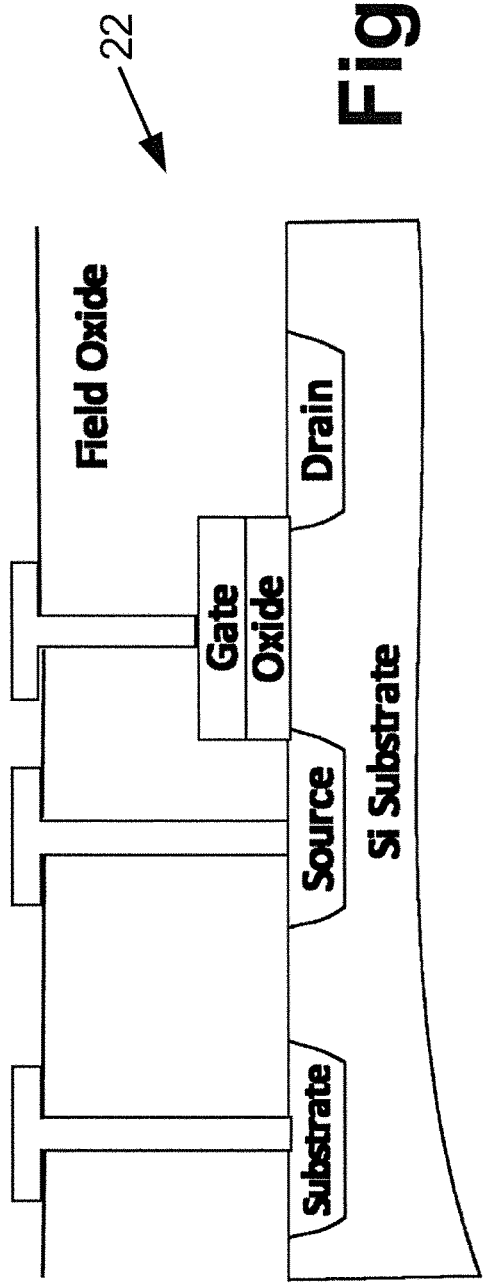
Figure 8:
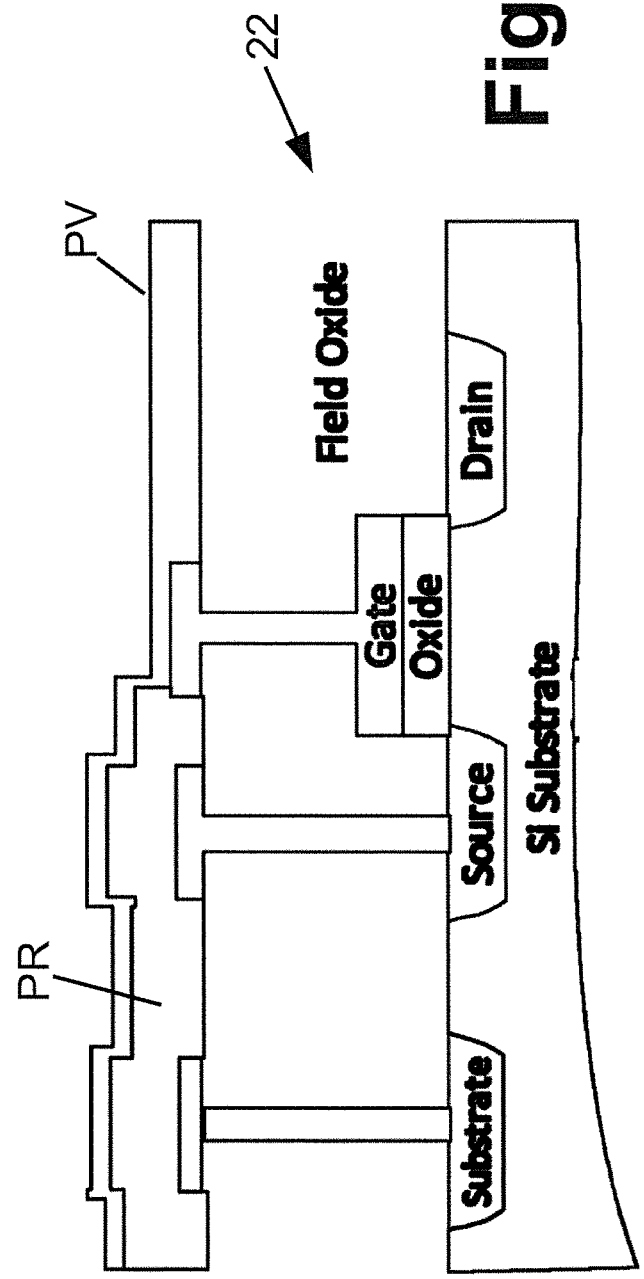

With reference to FIGS. 7, 8, 9, and 10, an illustrative fabrication process for manufacturing the VocP 10 of FIGS. 1 and 2 is illustrated. FIG. 7 illustrates an embodiment of the transistor 22 comprising a standard NMOS transistor fabricated with substrate, source, gate, and drain regions formed and overlaid with a field oxide having conductive feedthroughs defined. FIG. 8 illustrates deposition of photoresist PR and at least one photovoltaic layer PV. The photovoltaic layer PV may take any form suitable for a photovoltaic device operating in the target wavelength range, e.g. for a MWIR photovoltaic device the photovoltaic layer(s) PV may include spin coated lead salt, colloidal quantum dot (CQD), or so forth. In these techniques, the photovoltaic layer PV is disposed on the electronic circuit that includes the transistor 22 using spin coating of the photovoltaic device onto the electronic circuit. Alternatively, the photovoltaic layer(s) PV may be disposed on the transistor 22 using aligned transfer of a III-V MWIR photovoltaic detector onto the transistor 22 (or, more generally, onto the electronic circuit that includes the transistor). By way of further non-limiting illustration, the photovoltaic layer(s) PV may comprise a compound III-V photovoltaic device, a compound II-VI photovoltaic device, a compound IV-VI photovoltaic device, a lead selenide (PbSe) photovoltaic device, a quantum well infrared photodetector (QWIP) or a quantum dot infrared photodetector (QDIP). Fabrication of the VocP 10 is completed using standard semiconductor and photolithographic processing at wafer level. To this end, FIG. 9 illustrates removal of the photoresist PR (and of the portion of the photovoltaic layer overlaying the photoresist) and deposition of an oxide OX for delineating electrical traces. FIG. 10 illustrates the metallization step in which metal traces TR (e.g., transparent contact layer(s)) are deposited. The photovoltaic layer(s) PV and the connecting electrical traces TR define the photovoltaic device 20 electrically connected with the transistor 22 as diagrammatically depicted in FIGS. 1 and 2.

In designing the VocP 10, the IR sensitive material (that is, photovoltaic layer(s) PV of FIGS. 7-10) are preferably chosen to be compatible with standard fabrication methods, provide high responsivity and low dark current at room temperature, and provide broad or selectable spectral bandwidth. In some illustrative embodiments, the VocP 10 is integrated with ROIC using CIS technology. Although not illustrated, such an integrated VocP/ROIC may optionally include Electrostatic Discharge (ESD) protection for the MOSFET 22 of the VocP 10.

To integrate with a ROIC or other readout electronic circuit, the photodetector fabrication process may comprise fabricating a readout electronic circuit including an extra transistor (i.e. the transistor 22), and disposing the photovoltaic device 20 on the readout electronic circuit with the photovoltaic device 20 electrically connected to apply an open circuit voltage ($V_{OC}$) of the photovoltaic device 20 to the gate G of the extra transistor 22. The readout electronic circuit including the extra transistor may be fabricated as a silicon-based metal-oxide-semiconductor (MOS) circuit.

The disclosed VocP 10 facilitates reduction of cost of MWIR and SWIR imagers by leveraging commercial MOS (e.g. NMOS or CMOS) technology, e.g. CIS, improving manufacturing reliability with wafer scale processing, operating at room temperature (stabilized), and maintaining signal level with decreasing pixel size.

Figure 11:
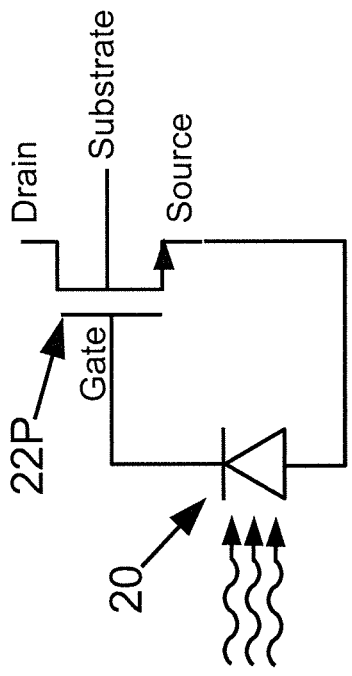
FIGS. 11, 12, 13, and 14 diagrammatically illustrate some alternative embodiments of the VocP of FIGS. 1 and 2.
Figure 12:
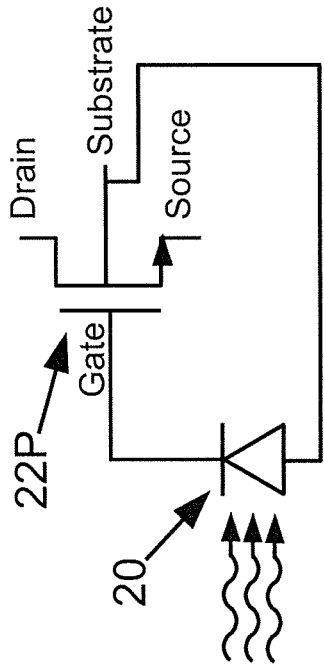
Figure 13:
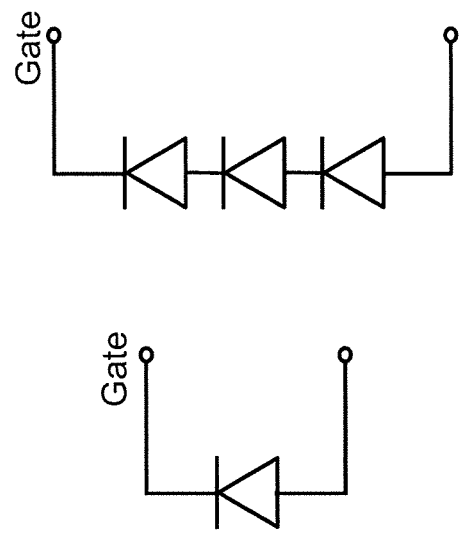
Figure 14:
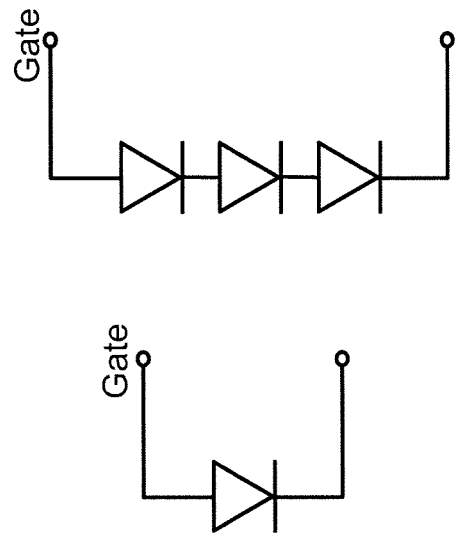

With reference to FIGS. 11, 12, 13, and 14, while the VocP 10 of FIGS. 1 and 2 employs an NMOS as the transistor 22, in other embodiments other types of transistors with variant topologies may be employed. FIG. 11 illustrates a VocP with a source grounded topology, employing a PMOS transistor 22P. FIG. 12 illustrates a VocP with a substrate grounded topology, employing a PMOS transistor 22P. In general, FIG. 13 illustrates the orientation of the photovoltaic device 20 when using p-channel MOS, while FIG. 14 illustrates the orientation of the photovoltaic device 20 when using n-channel MOS. In FIGS. 13 and 14, "Gate" indicates the terminal electrically connected with the gate of the p-channel or n-channel MOS. FIGS. 13 and 14 also illustrate that the photovoltaic device 20 can be constructed as a series connection of two or more photovoltaic junctions. Moreover, it will be appreciated that the transistor 22 may be embodied as other types of transistors with high impedance gate terminals, such as enhancement mode n-channel metal oxide semiconductor (NMOS), depletion mode n-channel metal oxide semiconductor (NMOS), enhancement mode p-channel metal oxide semiconductor (PMOS), enhancement mode p-channel metal oxide semiconductor (PMOS), n-channel Junction Field Effect Transistors (n-JFETs), p-channel Junction Field Effect Transistors (p-JFETs), n-channel high electron mobility transistors (n-HEMTs), p-channel high electron mobility transistors (p-HEMTs), enhancement mode n-channel metal semiconductor field effects semiconductors (n-MESEETs), depletion mode n-channel metal semiconductor field effects semiconductors (n-MESFETs), enhancement mode p-channel metal semiconductor field effects semiconductors (p-MESFETs), depletion mode p-channel metal semiconductor field effects semiconductors (p-MESFETs), Metal-Nitride-Oxide-Semiconductor transistor (MNOS), modulation-doped field-effect transistor (MODFET) devices, more generally various field-effect transistor (FET) device types, an npn homojunction bipolar junction transistor, a pnp homojunction bipolar junction transistor, an npn heterojunction bipolar junction transistor (HBT), a pnp homojunction bipolar junction transistor (HBT), or so forth. The illustrative VocP devices are manufactured in MOS technology (e.g. CMOS), but other material technologies are contemplated such as GaAs or other III-V compound semiconductor technologies.

The photovoltaic device of the VocP 10 may be any device with a photovoltaic junction exhibiting sensitivity to light of the desired wavelength range, e.g. the photovoltaic device may be a pn junction device, a Schottky diode with a metal/semiconductor photovoltaic junction (i.e. Schottky junction), or so forth. As some further non-limiting illustrative examples, the photovoltaic device may comprise III-V bulk semiconductors such as but not limited to $InAs_xSb_{1-x}$ (x=0 to 1 to cover mid-wave infrared, e.g. 3-5 µm, and long wave infrared, e.g. 5-13 µm), InGaAlAsSb, III-V quantum confined semiconductors such as but not limited to InAs/(In,Ga)Sb superlattices/quantum wells/quantum wires/quantum dots, InAs/In(As,Sb) superlattices/quantum wells/quantum wires/quantum dots, (In,Ga)As/In(As,Sb) superlattices/quantum wells/quantum wires/quantum dots, (In,Al)As/(In,Al)Sb superlattices/quantum wells/quantum wires/quantum dots, II-VI bulk semiconductors such as but not limited to HgCdTe(x=0 to 1 to cover near-infrared, e.g. 0.7-1.5 µm, short-wave infrared, e.g. 1.5-3 µm), mid-wave infrared, 3-5 µm, long wave infrared, 5-14 µm, and very long wave-infrared, >14 µm), PbTeSe, II-VI quantum confined semiconductors such as but not limited to (Hg,Cd)(Te,Se) superlattices/quantum wells/quantum wires/quantum dots, (Pb,Cd)(Te,Se) superlattices/quantum wells/quantum wires/quantum dots (Hg,Cd)(Te,Se), II-VI bulk semiconductors such as but not limited to HgCdTe(x=0 to 1 to cover near-infrared, e.g. 0.7-1.5 µm, short-wave infrared, e.g. 1.5-3 µm, mid-wave infrared, e.g. 3-5 µm, long wave infrared, e.g. 5-14 µm, and very long wave-infrared, e.g. >14 µm), PbTeSe, II-VI quantum confined semiconductors such as but not limited to (Hg,Cd)(Te,Se) superlattices/quantum wells/quantum wires/quantum dots, (Pb,Cd)(Te,Se) superlattices/quantum wells/quantum wires/quantum dots (Hg,Cd)(Te,Se), various combinations thereof, and so forth.

In some illustrative embodiments, the VocP includes the photovoltaic device and the transistor (e.g. a FET), with the photovoltaic device connected with the gate terminal of the transistor to input an open circuit voltage of the photovoltaic device to the gate terminal of the transistor. As disclosed herein, the relatively weak dependence of the open-circuit voltage of the photovoltaic device is "multiplied" by the exponential dependence of the FET channel current on the gate voltage to provide a FET channel current-versus-illumination photo-response that is approximately linear. As shown in FIGS. 13 and 14, the photovoltaic device may include a plurality of photovoltaic junctions electrically connected in series to define a two terminal photovoltaic device having an anode and a cathode.

The illustrative embodiment employs a source-follower configuration in which the cathode of the photovoltaic device is electrically connected with the substrate of the MOSFET. However, in other contemplated embodiments may employ other amplifier circuit configurations, e.g. as shown in FIGS. 11 and 12.

The preferred embodiments have been described. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A photodetector comprising:
   a photovoltaic device including a photovoltaic junction; and
   a transistor having a gate terminal;
   wherein the photovoltaic device is connected to input an open circuit voltage of the photovoltaic device to the gate terminal of the transistor so that the magnitude of the gate-to source voltage of the transistor is equal to the open circuit voltage of the photovoltaic device.

2. The photodetector of claim 1 wherein the transistor is a metal-oxide-semiconductor field-effect transistor (MOSFET).

3. The photodetector of claim 2 wherein the photovoltaic device includes a plurality of photovoltaic junctions electrically connected in series to define a two terminal photovoltaic device having an anode and a cathode.

4. The photodetector of claim 1 wherein the photovoltaic junction comprises a pn junction or a Schottky junction.

5. The photodetector of claim 1 wherein the photovoltaic device comprises an infrared photovoltaic device.

6. The photodetector of claim 1 wherein the transistor further includes a channel having a channel current modulated by voltage on the gate terminal and the photodetector further comprises:
a readout electronic circuit electrically connected with the channel of the transistor to output a voltage dependent upon the channel current.

7. An image sensor comprising an array of photodetectors as set forth in claim 6.

8. The image sensor of claim 7 wherein the readout electronic circuit comprises a readout integrated circuit (ROIC).

9. The image sensor of claim 8 wherein the transistor of each photodetector comprises a metal-oxide-semiconductor field-effect transistor (MOSFET), the ROIC for each photodetector comprises a circuit including one or more transistors, and the image sensor comprises a CMOS Image Sensor (CIS) based on CIS pixel unit cells.

10. The photodetector of claim 1 wherein:
the transistor is a metal-oxide-semiconductor field-effect transistor (MOSFET);
the photovoltaic device includes a plurality of photovoltaic junctions electrically connected in series to define a two terminal photovoltaic device having an anode and a cathode; and
the photovoltaic junctions comprise pn junctions or Schottky junctions.

11. The photodetector of claim 10 wherein the photovoltaic device comprises an infrared photovoltaic device.

12. The photodetector of claim 1 wherein the transistor is a metal-oxide-semiconductor field-effect transistor (MOSFET) and the cathode of the photovoltaic device is electrically connected with the substrate of the MOSFET.

13. A photodetector comprising:
a photovoltaic device including a photovoltaic junction; and
a transistor having a gate terminal;
wherein the photovoltaic device is connected to the gate terminal of the transistor to input an open circuit voltage of the photovoltaic device to the gate terminal of the transistor;
wherein the photodetector comprises a hybrid device in which the transistor is silicon-based and the photovoltaic device comprises a compound III-V photovoltaic device, a compound II-VI photovoltaic device, a compound IV-VI photovoltaic device, a lead selenide (PbSe) photovoltaic device, a quantum well infrared photodetector (QWIP) or a quantum dot infrared photodetector (QDIP).

14. A photodetection method comprising:
generating an open circuit voltage in a photovoltaic device in response to illumination by incident radiation; and
applying the open circuit voltage to a gate terminal of a transistor to modulate a channel current flowing in a channel of the transistor;
wherein:
the open circuit voltage in the photovoltaic device has logarithmic linearity respective to an optical power of the illumination; and
the channel current flowing in the channel of the transistor is a subthreshold current having an exponential linearity respective to the open circuit voltage applied to the gate terminal of the transistor;
whereby the channel current comprises a photocurrent having linearity respective to the optical power of the illumination.

15. The photodetection method of claim 14 wherein:
the open circuit voltage in the photovoltaic device is $$V_{OC} = \frac{kT}{q} \ln\left(\frac{R_\lambda P_\lambda}{I_{sat}} + 1\right)$$

where $V_{OC}$ is the open circuit voltage in the photovoltaic device, k is the Boltzmann constant, T is a temperature, q is the elementary charge, $I_{sat}$ is the saturation current of the photovoltaic device, and $R_\lambda$ is a responsivity as a function of wavelength $\lambda$; and
the channel current flowing in the channel of the transistor is $$I_{DS} = I_{S,s-t} \exp\left(\frac{q(V_{GS} - V_T)}{n_T kT}\right)$$

where $I_{DS}$ is the channel current flowing in the channel of the transistor, $I_{S,s-t}$ is a subthreshold transistor current, $V_{GS}$ is the gate to source voltage of the transistor, $V_T$ is the threshold voltage of the transistor, and $n_T$ is the ideality factor of the transistor at the temperature T.

16. A photodetector fabrication process comprising:
fabricating an electronic circuit including a transistor; and
disposing a photovoltaic device on the electronic circuit with the photovoltaic device electrically connected to apply an open circuit voltage of the photovoltaic device to a gate of the transistor so that the magnitude of the gate-to source voltage of the transistor is equal to the open circuit voltage of the photovoltaic device.

17. The photodetector fabrication process of claim 16 wherein the fabricating comprises:
fabricating a readout electronic circuit including an extra transistor consisting of the transistor.

18. The photodetector fabrication process of claim 16 wherein the fabricating comprises:
fabricating the readout electronic circuit including the extra transistor as a silicon-based metal-oxide-semiconductor (MOS) circuit.

19. The photodetector fabrication process of claim 16 wherein the disposing of the photovoltaic device on the electronic circuit is performed using aligned transfer of the photovoltaic device onto the electronic circuit.

20. The photodetector fabrication process of claim 16 wherein the disposing of the photovoltaic device on the electronic circuit is performed using spin coating of the photovoltaic device onto the electronic circuit.

* * * * *